(12) United States Patent
Tae et al.

(10) Patent No.: US 10,280,343 B2
(45) Date of Patent: May 7, 2019

(54) ADHESIVE RESIN COMPOSITION, ADHESIVE FILM, AND FLEXIBLE METAL LAMINATE

(71) Applicant: SHENGYI TECHNOLOGY CO., LTD., Dongguan, Guangdong (CN)

(72) Inventors: Young Ji Tae, Daejeon (KR); Young Seok Park, Daejeon (KR); Byeong In Ahn, Daejeon (KR)

(73) Assignee: SHENGYI TECHNOLOGY CO., LTD., Dongguan, Guangdong (CN)

( * ) Notice: Subject to any disclaimer, the term of this patent is extended or adjusted under 35 U.S.C. 154(b) by 0 days.

(21) Appl. No.: 15/521,359

(22) PCT Filed: Dec. 8, 2015

(86) PCT No.: PCT/KR2015/013384
§ 371 (c)(1),
(2) Date: Apr. 24, 2017

(87) PCT Pub. No.: WO2016/093593
PCT Pub. Date: Jun. 16, 2016

(65) Prior Publication Data
US 2017/0313916 A1 Nov. 2, 2017

(30) Foreign Application Priority Data
Dec. 8, 2014 (KR) ........................ 10-2014-0174976

(51) Int. Cl.
| | |
|---|---|
| C09J 151/00 | (2006.01) |
| C09J 163/00 | (2006.01) |
| C09J 7/00 | (2018.01) |
| B32B 7/12 | (2006.01) |
| B32B 15/08 | (2006.01) |
| B32B 27/28 | (2006.01) |
| C09J 9/00 | (2006.01) |
| C09J 11/08 | (2006.01) |
| H05K 1/03 | (2006.01) |
| C09J 7/10 | (2018.01) |
| H05K 1/09 | (2006.01) |
| C08G 59/40 | (2006.01) |
| C08G 59/50 | (2006.01) |

(52) U.S. Cl.
CPC ............. *C09J 151/003* (2013.01); *B32B 7/12* (2013.01); *B32B 15/08* (2013.01); *B32B 27/281* (2013.01); *C09J 7/00* (2013.01); *C09J 7/10* (2018.01); *C09J 9/00* (2013.01); *C09J 11/08* (2013.01); *C09J 151/006* (2013.01); *C09J 163/00* (2013.01); *H05K 1/0346* (2013.01); *H05K 1/0353* (2013.01); *H05K 1/0393* (2013.01); *B32B 2309/105* (2013.01); *B32B 2457/08* (2013.01); *C08G 59/4042* (2013.01); *C08G 59/50* (2013.01); *C08G 59/5073* (2013.01); *C09J 2201/622* (2013.01); *C09J 2203/326* (2013.01); *C09J 2205/114* (2013.01); *C09J 2425/00* (2013.01); *C09J 2451/00* (2013.01); *C09J 2463/00* (2013.01); *H05K 1/09* (2013.01); *H05K 2201/015* (2013.01); *H05K 2201/0154* (2013.01)

(58) Field of Classification Search
CPC ........ C09J 151/00; C09J 163/00; B32B 27/28
See application file for complete search history.

(56) References Cited

U.S. PATENT DOCUMENTS

| | | | | |
|---|---|---|---|---|
| 3,970,608 | A * | 7/1976 | Furukawa | ............... C08C 19/06 525/328.1 |
| 5,001,542 | A | 3/1991 | Tsukagoshi et al. | |
| 5,037,885 | A * | 8/1991 | Mori | .................... C09D 163/00 525/65 |
| 5,120,665 | A | 6/1992 | Tsukagoshi et al. | |
| 5,843,251 | A * | 12/1998 | Tsukagoshi | ........... H01L 21/563 156/64 |
| 6,113,728 | A | 9/2000 | Tsukagoshi et al. | |
| 2002/0006515 | A1 | 1/2002 | Luttrull | |
| 2005/0287363 | A1* | 12/2005 | Ring | .................... C09J 153/025 428/346 |
| 2013/0065018 | A1* | 3/2013 | Park | ....................... H05K 1/036 428/141 |
| 2014/0335341 | A1 | 11/2014 | Park et al. | |
| 2015/0197676 | A1 | 7/2015 | Takenaka et al. | |

FOREIGN PATENT DOCUMENTS

| | | | | |
|---|---|---|---|---|
| JP | 2005-248004 | A | 9/2005 | |
| JP | 2009127031 | A * | 6/2009 | ............ C09J 163/00 |
| JP | 5002074 | B2 | 8/2012 | |
| JP | 2013-170214 | A | 9/2013 | |
| JP | 2014-034668 | A | 2/2014 | |

(Continued)

OTHER PUBLICATIONS

Search Report and Written Opinion issued for International Application No. PCT/KR2015/013384 dated Mar. 31, 2016 (15 pages).

*Primary Examiner* — Rip A Lee
(74) *Attorney, Agent, or Firm* — Rothwell, Figg, Ernst & Manbeck, P.C.

(57) ABSTRACT

The present invention relates to an adhesive resin composition including a styrene-ethylene-butylene-styrene copolymer with a specific chemical structure, an epoxy resin, an acid anhydride compound, and a curing catalyst, an adhesive film obtained from the resin composition, and a flexible metal laminate including the adhesive film.

19 Claims, No Drawings

(56) References Cited

FOREIGN PATENT DOCUMENTS

| | | |
|---|---|---|
| JP | 2014-070099 A | 4/2014 |
| JP | 5463110 B2 | 4/2014 |
| JP | 2014-086591 A | 5/2014 |
| KR | 10-0072808 B1 | 4/1994 |
| KR | 10-1013074 B1 | 2/2011 |
| KR | 10-2013-0027442 A | 3/2013 |
| KR | 10-2013-0066527 A | 6/2013 |
| KR | 10-1353825 B1 | 1/2014 |

* cited by examiner

ADHESIVE RESIN COMPOSITION, ADHESIVE FILM, AND FLEXIBLE METAL LAMINATE

CROSS-REFERENCE TO RELATED APPLICATIONS

This application is a 35 U.S.C. § 371 National Phase Entry Application from PCT/KR2015/013384, filed on Dec. 8, 2015, and designating the United States, which claims priority under 35 U.S.C. § 119 to Korean Patent Application No. 10-2014-0174976 filed on Dec. 8, 2014 with the Korean Intellectual Property Office, the disclosure of which is herein incorporated by reference in its entirety.

FIELD OF THE INVENTION

The present invention relates to an adhesive resin composition, an adhesive film, and a flexible metal laminate, and more specifically, to an adhesive resin composition and an adhesive film that have high heat resistance and mechanical properties, may be applied in the manufacturing process of a flexible printed circuit board to secure high reliability, and exhibit a low dielectric constant and a low dielectric loss factor, and a flexible metal laminate including the adhesive film.

BACKGROUND OF THE INVENTION

With the recent tendencies of miniaturization and increased speed of electronic devices and combination of various functions thereof, signal transmission speed in electronic devices or signal transmission speed to the outside of electronic devices is increasing. Thus, a printed circuit board using an insulator with a lower dielectric constant and dielectric loss factor than those of the existing insulator is required.

Previously known bonding sheets and coverlays are generally made of an adhesive epoxy resin composition, but the dielectric constant increases due to the unique properties of the epoxy resin, and thus it is not easy to lower the dielectric constant and dielectric loss factor of the final product. Further, since elastomers commonly used in the adhesive epoxy resin composition such as butadiene/acrylonitrile (CTBN) with a carboxylic group end, etc. also have a high dielectric constant and dielectric loss factor, there was a certain limit to the application for more micronized and highly integrated semiconductor devices.

For example, Korean Registered Patent No. 0072808 discloses an adhesive tape including: a liquid epoxy resin; a solid resin; and a micro-capsule type of curing agent, and the adhesive tape can secure high heat resistance or adhesion to a substrate, but it is difficult to secure a low dielectric constant due to the use of a high content of epoxy resin having a high dielectric constant, and there is no suggestion of a method for lowering a dielectric constant or dielectric loss factor.

In addition, Japanese Laid-Open Patent Publication No. 2013-170214 discloses an epoxy resin composition including an epoxy resin, rubber components including maleic anhydride modified hydrogenated styrene butadiene rubber as a main component, polyphenylene ether, and an inorganic metal salt of a phosphorus compound, and the epoxy resin composition has high adhesion to a polyimide substrate and can secure high moisture tolerance, but there is no suggestion of a method for lowering a dielectric constant or dielectric loss factor.

PRIOR ART

Patent Document (Patent Document 1) Korean Registered Patent No. 0072808
(Patent Document 2) Japanese Laid-Open Patent Publication No. 2013-170214

DETAILED DESCRIPTION OF THE INVENTION

Technical Problem

It is an object of the present invention to provide an adhesive resin composition that has high heat resistance and mechanical properties, may be applied in the manufacturing process of a flexible printed circuit board to secure high reliability, and exhibits a low dielectric constant and a low dielectric loss factor.

It is another object of the present invention to provide an adhesive film that has high heat resistance and mechanical properties, may be applied in the manufacturing process of a flexible printed circuit board to secure high reliability, and exhibits a low dielectric constant and a low dielectric loss factor.

It is still another object of the present invention to provide a flexible metal laminate that exhibits a low dielectric constant and a low dielectric loss factor as well as high heat resistance and mechanical properties.

Technical Solution

There is provided an adhesive resin composition including styrene-ethylene-butylene-styrene copolymer to which 0.1 wt % to 15 wt % of dicarboxylic acid or an anhydride thereof is bonded; an epoxy resin; a curing catalyst including one or more compounds selected from the group consisting of an imidazole-based compound, an imine-based compound and an amine-based compound; and an acid anhydride compound, and wherein the adhesive resin composition has a dielectric constant of 2.8 or less in a dried state and at 5 GHz.

There is also provided an adhesive film including a cured product of the adhesive resin composition, and having a dielectric constant (Dk) of 2.8 or less in a dried state and at 5 GHz.

There is also provided a flexible metal laminate including a polyimide resin film; a metal thin film including one or more selected from the group consisting of copper, iron, nickel, titanium, aluminum, silver, gold, and alloys of two or more kinds thereof; and the above-described adhesive film formed between the polyimide film and the metal thin film.

Hereinafter, an adhesive resin composition and an adhesive film according to specific embodiments of the present invention will be explained in detail.

According to one embodiment of the present invention, an adhesive resin composition including a styrene-ethylene-butylene-styrene copolymer to which 0.1 wt % to 15 wt % of dicarboxylic acid or an anhydride thereof is bonded; an epoxy resin; a curing catalyst including one or more compounds selected from the group consisting of an imidazole-based compound, an imine-based compound, and an amine-based compound; and an acid anhydride compound, and having a dielectric constant of 2.8 or less in a dried state and at 5 GHz, is provided.

The present inventors confirmed through experiments that an adhesive resin composition obtained by using a styrene-ethylene-butylene-styrene copolymer to which 0.1 wt % to 15 wt % of dicarboxylic acid or an anhydride thereof is bonded, a specific acid anhydride compound and curing catalyst together with an epoxy resin may have high heat resistance and mechanical properties, may be applied in the manufacturing process of a flexible printed circuit board to secure high reliability, and may exhibit a low dielectric constant and a low dielectric loss factor, and completed the present invention.

Since the adhesive resin composition includes a styrene-ethylene-butylene-styrene copolymer to which 0.1 wt % to 15 wt % of dicarboxylic acid or an anhydride thereof is bonded, the finally prepared adhesive film may secure high mechanical properties as well as high elasticity while maintaining the heat resistance of the epoxy resin to an equivalent or superior degree, and the adhesive resin composition or an adhesive film prepared therefrom may have a low dielectric constant and a low dielectric loss factor.

The dicarboxylic acid or an anhydride thereof may be substituted at the end of the styrene-ethylene-butylene-styrene copolymer in the content of 0.1 wt % to 15 wt % or 0.2 wt % to 10 wt %, or grafted on the main chain of the copolymer in the content of 0.1 wt % to 15 wt % or 0.2 wt % to 10 wt %.

The dicarboxylic acid may include one or more compounds selected from the group consisting of maleic acid, phthalic acid, itaconic acid, citraconic acid, alkenyl succinic acid, cis-1,2,3,6-tetrahydrophthalic acid, and 4-methyl-1,2,3,6-tetrahydrophthalic acid.

The styrene-ethylene-butylene-styrene copolymer to which 0.1 wt % to 15 wt % of dicarboxylic acid or an anhydride thereof is bonded may have a weight average molecular weight of 30,000 to 800,000, preferably 20,000 to 200,000.

The styrene-ethylene-butylene-styrene copolymer to which 0.1 wt % to 15 wt % of dicarboxylic acid or an anhydride thereof is bonded may include 5 to 50 wt % of styrene-derived repeat units. If the content of styrene-derived repeat units is too small in the styrene-ethylene-butylene-styrene copolymer, the heat resistance of the adhesive resin composition and products prepared therefrom may be largely deteriorated. Further, if the content of styrene-derived repeat units is too high in the styrene-ethylene-butylene-styrene copolymer, compatibility with the epoxy resin included in the adhesive resin composition may be deteriorated.

The styrene-ethylene-butylene-styrene copolymer to which 0.1 wt % to 15 wt % of dicarboxylic acid or an anhydride thereof is bonded may constitute 30 wt % to 80 wt %, or 25 wt % to 75 wt % in the solid content of the adhesive resin composition (remaining components excluding an organic solvent, water, or water soluble solvent components).

Meanwhile, the adhesive resin composition may include, based on 100 parts by weight of the styrene-ethylene-butylene-styrene copolymer to which 0.1 wt % to 15 wt % of dicarboxylic acid or an anhydride thereof is bonded, 10 to 80 parts by weight or 20 to 60 parts by weight of epoxy resin.

The epoxy resin allows the adhesive resin composition or adhesive film prepared therefrom to have high heat resistance and mechanical properties.

In addition, by including, based on 100 parts by weight of the styrene-ethylene-butylene-styrene copolymer, 10 to 80 parts by weight or 20 to 60 parts by weight of the epoxy resin, the adhesive resin composition or adhesive film prepared therefrom may have a low dielectric constant and a low dielectric loss factor. Specifically, the adhesive resin composition may have a dielectric constant (Dk) of 2.8 or less or 2.2 to 2.8, and a dielectric loss factor (Df) of 0.010 or less or 0.010 to 0.001, in a dried state and at 5 GHz.

If the content of the epoxy resin is too high compared to the styrene-ethylene-butylene-styrene copolymer in the adhesive resin composition, the adhesive resin composition or an adhesive film prepared therefrom may have a high dielectric constant and a high dielectric loss factor, and when practically used, resin flow may become excessively large. If the content of the epoxy resin is too small compared to the styrene-ethylene-butylene-styrene copolymer in the adhesive resin composition, the heat resistance or mechanical properties of the adhesive resin composition and an adhesive film prepared therefrom may be deteriorated and adhesive strength itself may be deteriorated.

The epoxy resin may include one or more selected from the group consisting of biphenyl novolac epoxy resin, a bisphenol A type of epoxy resin, and a dicylcopentadiene phenol addition reaction type of epoxy resin, and preferable examples of the epoxy resin may include a biphenyl novolac epoxy resin or a dicyclopentadiene phenol addition reaction type of epoxy resin.

In order to lower the dielectric constant and dielectric loss factor while increasing the heat resistance of the adhesive resin composition, it is preferable to have an epoxy equivalent of 200 g/eq to 500 g/eq.

Meanwhile, the acid anhydride may include one or more compounds selected from the group consisting of a styrene-maleic anhydride copolymer, methyltetrahydrophthalic anhydride, phthalic anhydride, hexahydrophthalic anhydride, tetrahydrophthalic anhydride, methylhexahydrophthalic anhydride, methyl himic anhydride, NADIC methyl anhydride, NADIC anhydride, and dodecenyl succinic anhydride.

Such acid anhydride compounds not only lower the dielectric constant of the adhesive resin composition and an adhesive film prepared therefrom, but also secure high adhesive strength and heat resistance, and if the adhesive resin composition exists in the state of varnish or exists in the state of a semi-cured adhesive film, it allows the adhesive resin composition to secure high storage stability.

Commonly known curing agents, curing accelerators, curing catalysts, etc. significantly increase the dielectric constant or dielectric loss factor of the resin composition or an adhesive film prepared therefrom, while the above-explained specific acid anhydride compounds, when used together with the above-explained styrene-ethylene-butylene-styrene copolymer and epoxy resin, allow the resin composition of one embodiment or an adhesive film prepared therefrom to have a dielectric constant of 2.8 or less in a dried state and at 5 GHz, and a dielectric loss factor (Df) of 0.010 or less in a dried state and at 5 GHz.

Among the acid anhydride compound, as the styrene-maleic anhydride copolymer, styrene-maleic anhydride copolymers having a weight average molecular weight of 1000 to 50,000 or 5000 to 25,000 may be used.

The styrene-maleic anhydride copolymer may include 50 wt % to 95 wt % or 60 wt % to 90 wt % of styrene-derived repeat units.

The adhesive resin composition may include, based on 100 parts by weight of the styrene-ethylene-butylene-styrene copolymer to which 0.1 wt % to 15 wt % of dicarboxylic acid or an anhydride thereof is bonded, 10 to 80 parts by weight or 20 to 60 parts by weight of the acid anhydride compounds.

If the content of the acid anhydride compound is too small in the adhesive resin composition, the coating property or heat resistance and mechanical properties of an adhesive film prepared from the adhesive resin composition may not be sufficient, and it may be difficult to sufficiently lower the dielectric constant and dielectric loss factor of the adhesive film. If the content of the acid anhydride compound is too high in the adhesive resin composition, hygroscopicity may increase and heat resistance may be deteriorated, and the dielectric constant and dielectric loss factor of products prepared from the adhesive resin composition may increase.

Specifically, the weight ratio of the epoxy resin to the acid anhydride compound may be 2.0 to 0.05, 1.5 to 0.10, 1.0 to 0.12, or 0.75 to 0.15. The weight ratio of the epoxy resin to the acid anhydride compound is the weight ratio of the solid content of the epoxy resin and the solid content of the acid anhydride compound. If the weight ratio of the epoxy resin to the acid anhydride compound is too high, it may be difficult to sufficiently lower the dielectric constant and dielectric loss factor of an adhesive film prepared from the adhesive resin composition, and resin flow may become excessively high. If the weight ratio of the epoxy resin to the acid anhydride compound is too low, the adhesive strength of the adhesive resin composition may be deteriorated, or the heat resistance and chemical resistance may be deteriorated.

The adhesive resin composition may further include an organic solvent. Specifically, the adhesive resin composition may further include, based on 100 parts by weight of the styrene-ethylene-butylene-styrene copolymer, 50 to 1000 parts by weight of the organic solvent.

The organic solvent may control the viscosity of the adhesive resin composition to facilitate the preparation of an adhesive film. The organic solvent may be used considering specific components, viscosity, etc. of the adhesive resin composition, and for example, toluene, xylene, propylene, glycol monomethyl ether acetate, benzene, acetone, methylethylketone, tetrahydrofurane, dimethylformaldehyde, cyclohexanone, methylcellosolve, methanol, ethanol, etc. may be used.

The adhesive resin composition has high compatibility between the above-explained constructional components, and excellent dispersibility, and thus, even if further including the organic solvent, may maintain a stable composition for a long time. Specifically, the viscosity of the adhesive resin composition may change within a range of 2 times or 1.5 times or less, or 1.1 times or less compared to the initial viscosity, within 72 hours, when exposed to the outside at room temperature. In the case of an adhesive resin including an epoxy, an amine-based curing agent, and an organic solvent, the viscosity changes within a range of 3 times or more compared to the initial viscosity when exposed to the outside at room temperature, while the adhesive resin composition of one embodiment has relatively high storage stability at room temperature.

The adhesive resin composition may include a commonly known curing catalyst, for example, a curing catalyst including one or more compounds selected from the group consisting of an imidazole-based compound, an imine-based compound, and an amine-based compound Specifically, the adhesive resin composition may include, based on 100 parts by weight of the styrene-ethylene-butylene-styrene copolymer to which 0.1 wt % to 15 wt % of dicarboxylic acid or an anhydride thereof is bonded, 0.05 to 5 parts by weight or 0.1 to 2 parts by weight of the curing catalyst.

The adhesive resin composition may include commonly known additives, for example, a flame retardant, a filler, etc., besides the above-explained components. As the flame retardant, commonly used flame retardants may be used without specific limitations, and for example, a phosphorus flame retardant OP-935 (Clariant Company), a non-ionic phosphorus flame retardant FP series (Fushimi Company), etc. may be used. As the filler, inorganic particles such as silica, etc. may be used without specific limitations, and for example, SFP-30MHE (DENKA Company), etc. may be used, an organic filler such as polypropylene oxide, etc. may be used, and an organic-inorganic composite filler may be used.

According to another embodiment of the invention, an adhesive film including a cured product of the above-described adhesive resin composition, and having a dielectric constant (Dk) of 2.8 or less in a dried state and at 5 GHz, is provided.

As explained above, if an adhesive resin composition including a styrene-ethylene-butylene-styrene copolymer to which 0.1 wt % to 15 wt % of dicarboxylic acid or an anhydride thereof is bonded, the above-explained acid anhydride compound, and the curing catalyst together with an epoxy resin is used, an adhesive film that may have high heat resistance and mechanical properties may be applied in the manufacturing process of a flexible printed circuit board to secure high reliability, and may exhibit a low dielectric constant and a low dielectric loss factor, can be provided.

Specifically, the adhesive film may have a dielectric constant (Dk) of 2.2 to 2.8 in a dried state and at 5 GHz.

The adhesive film may have a dielectric loss factor (Df) of 0.010 or less, or 0.010 to 0.001, in a dried state and at 5 GHz.

The shape, thickness, etc. of the adhesive film is not particularly limited, and may be adjusted considering the size, use, properties, etc. of the applied circuit board, etc., and for example, the adhesive film may have a thickness of 1 μm to 100 μm.

The adhesive film may be prepared using various methods and apparatuses known to be used in the preparation of a polymer film or an adhesive film without specific limitations, and for example, it may be prepared by applying the adhesive resin composition of one embodiment on a predetermined substrate and drying at a temperature of 40° C. or more.

According to still another embodiment of the invention, a flexible metal laminate including a polyimide resin film; a metal thin film including one or more selected from the group consisting of copper, iron, nickel, titanium, aluminum, silver, gold, and alloys of two or more kinds thereof; and the above-described adhesive film formed between the polyimide film and the metal thin film, is provided.

By including the above-explained adhesive film, the flexible metal laminate not only has high heat resistance and mechanical properties, but also exhibits a low dielectric constant and a low dielectric loss factor. The adhesive film may realize high adhesive strength to the polyimide resin film as well as the metal thin film.

Specifically, the flexible metal laminate may have a dielectric constant (Dk) of 2.2 to 2.8 in a dried state and at 5 GHz.

Further, the flexible metal laminate may have a dielectric loss factor (Df) of 0.010 or less in a dried state and at 5 GHz.

Meanwhile, the polyimide resin included in the polyimide resin film may have a weight average molecular weight of 3000 to 600,000, or 50,000 to 300,000. If the weight average molecular weight of the polyimide resin is too small, when applied in a flexible metal laminate, etc., required mechanical properties, etc. cannot be sufficiently secured. If the weight average molecular weight of the polyimide resin is too large, the elasticity of the polyimide resin film may be deteriorated.

The polyimide resin film may have a thickness of 1 μm to 50 μm.

The polyimide resin film may further include 5 to 75 wt % of a fluorine-based resin, together with the polyimide resin.

Examples of the fluorine-based resin may include polytetrafluoroethylene (PTFE), a tetrafluoroethylene-perfluoroalkyl vinyl ether copolymer (PFA), a tetrafluoroethylene-hexafluoropropylene copolymer (FEP), an ethylene-tetrafluoroethylene copolymer resin (ETFE), a tetrafluoroethylene-chlorotrifluoroethylene copolymer (TFE/CTFE), ethylene-chlorotrifluoroethylene resin (ECTFE), mixtures of two or more kinds thereof, or copolymers of two or more kinds thereof. The fluorine-based resin may include particles having a longest diameter of 0.05 μm to 20 μm, or 0.1 μm to 10 μm.

The metal thin film may have a thickness of 0.1 μm to 50 μm.

The flexible metal laminate may include one metal thin film, or the flexible metal laminate may include two metal thin films opposing each other, in which case the polyimide resin film may be positioned between the two metal thin films opposing each other.

Advantageous Effects

According to the present invention, an adhesive resin composition and an adhesive film that may have high heat resistance and mechanical properties, may be applied to a manufacturing process of a flexible printed circuit board to secure high reliability, and exhibit a low dielectric constant and a low dielectric loss factor, can be provided.

DETAILED DESCRIPTION OF THE EMBODIMENTS

Specific embodiments of the invention will be explained in more detail in the following examples. However, the following examples are presented only as the illustration of the present invention, and the scope of the present invention is not limited by the following examples.

EXAMPLES AND COMPARATIVE EXAMPLES: PREPARATION OF ADHESIVE RESIN COMPOSITIONS AND ADHESIVE FILMS

Example 1

(1) Preparation of an Adhesive Resin Solution 20 g of a 20 wt % solution of a styrene-ethylene-butylene-styrene copolymer grafted with 1.81 wt % of maleic anhydride (M1913, manufactured by Asahi Kasei Corporation) in xylene, 0.814 g of a 70 wt % solution of biphenyl novolac-based epoxy resin (NC-3000H, manufactured by Nippon Kayaku Co. Ltd., epoxy equivalent 288 g/eq) in xylene, 5.0 g of a 40 wt % solution of styrene-maleic anhydride copolymer (EF-40, manufactured by Sartomer company, weight ratio of styrene:maleic anhydride=4:1) in xylene, and 0.13 g of a 25% solution of 2-methylimidazole in methanol were mixed at room temperature to prepare an adhesive resin composition (solution).

(2) Preparation of an Adhesive Film

The adhesive resin solution was applied on a PET film treated to be released and dried at 100° C. for 10 minutes to prepare an adhesive film with a thickness of about 25 μm.

Example 2

(1) Preparation of an Adhesive Resin Solution 20 g of a 20 wt % solution of styrene-ethylene-butylene-styrene copolymer grafted with 0.36 wt % of maleic anhydride (M1911, manufactured by Asahi Kasei Corporation) in xylene, 0.814 g of a 70 wt % solution of epoxy resin in xylene, 5.0 g of a 40 wt % solution of NADIC methyl anhydride in xylene, and 0.13 g of a 25% solution of 2-methylimidazole in methanol were mixed to prepare an adhesive resin composition (solution).

(2) Preparation of an Adhesive Film

The adhesive resin solution was applied on a PET film treated to be released and dried at 100° C. for 10 minutes to prepare an adhesive film with a thickness of about 25 μm.

Comparative Examples 1 to 3

(1) Preparation of Adhesive Resin Solutions

The components of the following Table 1 were mixed to prepare adhesive resin compositions (solutions) of Comparative Examples 1 to 3.

TABLE 1

|  | Comparative Example1 | Comparative Example2 | Comparative Example3 |
| --- | --- | --- | --- |
| Elastomer | N34J (Zeon corporation, CTBN) 20 wt % solution in methyethylketone: 20 g | M1913 (Asahi Kasei Corporation, SEBS-g-MA) 20 wt % solution in xylene: 20 g | M1913 (Asahi Kasei Corporation, SEBS-g-MA) 20 wt % solution in xylene: 20 g |
| Epoxy resin | NC-3000H (Nippon Kayaku Co. Ltd., biphenyl novolac-based epoxy resin) 70 wt % solution in methylethylketone: 2.85 g | YDPN-631 (Kukdo Chemical Co. Ltd., liquid phenol novolac-based epoxy resin): 4.0 g | YD-128 (Kukdo Chemical Co. Ltd., BPA type epoxy resin): 0.2 g |
| Curing agent | 4,4'-diaminodiphenyl sulfone 25 wt % solution in methyl cellosolve: 1.72 g | 4,4'-diaminodiphenyl sulfone 2 5 wt % solution in methyl cellosolve: 5.70 g | 4,4'-diaminodiphenyl sulfone 25 wt % solution in methyl cellosolve: 0.26 g |
| Curing catalyst | 2-methylimidazol 25% solution in methanol: 0.13 g | 2-methylimidazol 25% solution in methanol: 0.20 g | 2-methylimidazol 25% solution in methanol: 0.01 g |

(2) Preparation of Adhesive Films

The adhesive resin solutions obtained in Comparative Examples 1 to 3 were respectively applied on a PET film treated to be released and dried at 100° C. for 10 minutes to prepare adhesive films with each thickness of about 25 μm.

EXPERIMENTAL EXAMPLE: EVALUATION OF PROPERTIES OF ADHESIVE RESIN COMPOSITIONS AND ADHESIVE FILMS

Experimental Example 1: Evaluation of Storage Stability of Adhesive Resin Compositions (Solutions)

Each of the adhesive resin solutions obtained in the examples and comparative examples was maintained in a sealed state at room temperature (25° C.) for 3 days, and it was confirmed if viscosity increased or decreased. If the final viscosity after the exposure is within 100% of the initial viscosity, it was evaluated as good, and if it exceeds 100% of the initial viscosity, it was marked as faulty.

Experimental Example 2: Evaluation of Heat Resistance after Water Absorption of Adhesive Films Each of the adhesive films obtained in the examples and comparative examples was delaminated from the PET film and inserted between a polyimide film and a copper foil, and a pressure of 30 MPa was applied at 160° C. for 1 hour to compress it. Further, the obtained polyimide film-adhesive film-copper foil composite was aged under the conditions of an 85° C. temperature and 85% relative humidity for 24 hours, and then floated in a lead bath and heat resistance was evaluated.

If a blister was generated on the surface of the adhesive film, the adhesive film was evaluated as faulty, and if a blister was not generated, it was evaluated as good.

Experimental Example 3: Measurement of Dielectric Constant and Dielectric Loss Factor Each of the adhesive films obtained in the examples and comparative examples was put in a glove box, and dried for 24 hours under nitrogen purge, and then a dielectric constant and a dielectric loss factor under a 5 GHz condition was measured using an Agilent E5071B ENA device.

The results of Experimental Examples 1 to 3 are shown in the following Table 2.

TABLE 2

|  | Example 1 | Example 2 | Comparative Example 1 | Comparative Example 2 | Comparative Example 3 |
| --- | --- | --- | --- | --- | --- |
| Storage stability | Good | Good | Good | Faulty | Faulty |
| Heat resistance | Good | Good | Good | Good | Faulty |
| Dielectric constant (Dk) | 2.5 | 2.5 | 4.3 | 2.9 | 2.4 |
| Dielectric loss factor (Df) | 0.007 | 0.007 | 0.15 | 0.015 | 0.004 |

As shown in Table 1, it was confirmed that the adhesive films obtained in the examples have high storage stability and heat resistance, and have a dielectric constant (Dk) of 2.5 and a dielectric loss factor (Df) of 0.007 in a dried state and at 5 GHz.

To the contrary, it was confirmed that the adhesive films obtained in the comparative examples have lowered storage stability or heat resistance compared to the examples, and particularly, in the case of Comparative Example 3, heat resistance is not sufficient for use as an adhesive material of a flexible printed circuit board, and storage stability is very low, and thus it is difficult to prepare into a commercial product. It was also confirmed that the adhesive films of Comparative Examples 1 and 2 exhibit relatively high dielectric constants and dielectric loss factors.

What is claimed is:

1. An adhesive resin composition comprising: a styrene-ethylene-butylene-styrene copolymer to which 0.1 wt % to 15 wt % of dicarboxylic acid or an anhydride thereof is bonded;
   an epoxy resin;
   a curing catalyst comprising one or more compounds selected from the group consisting of an imidazole-based compound, an imine-based compound, and an amine-based compound; and
   an acid anhydride compound,
   wherein a weight ratio of the epoxy resin to the acid anhydride compound is 2.0 to 0.05, and wherein the adhesive resin composition has a dielectric constant (Dk) of 2.8 or less in a dried state and at 5 GHz.

2. The adhesive resin composition according to claim 1, wherein the acid anhydride compound includes one or more compounds selected from the group consisting of a styrene-maleic anhydride copolymer, methyltetrahydrophthalic anhydride, phthalic anhydride, hexahydrophthalic anhydride, tetrahydrophthalic anhydride, methylhexahydrophthalic anhydride, methyl himic anhydride, nadic methyl anhydride, nadic anhydride, and dodecenyl succinic anhydride.

3. The adhesive resin composition according to claim 1, wherein the dicarboxylic acid includes one or more selected from the group consisting of maleic acid, phthalic acid, itaconic acid, citraconic acid, alkenyl succinic acid, cis-1,2,3,6-tetrahydrophthalic acid, and 4-methyl-1,2,3,6-tetrahydrophthalic acid.

4. The adhesive resin composition according to claim 1, wherein the styrene-ethylene-butylene-styrene copolymer to which 0.1 wt % to 15 wt % of dicarboxylic acid or an anhydride thereof is bonded has a weight average molecular weight of 30,000 to 800,000.

5. The adhesive resin composition according to claim 1, wherein the styrene-ethylene-butylene-styrene copolymer to which 0.1 wt % to 15 wt % of dicarboxylic acid or an anhydride thereof is bonded comprises 5 to 50 wt % of styrene-derived repeat units.

6. The adhesive resin composition according to claim 1, wherein the epoxy resin includes one or more selected from the group consisting of biphenyl novolac epoxy resin, bisphenol A epoxy resin, and dicylcopentadiene phenol epoxy resin.

7. The adhesive resin composition according to claim 1, wherein the adhesive resin composition comprises, based on 100 parts by weight of the styrene-ethylene-butylene-styrene copolymer to which 0.1 wt % to 15 wt % of dicarboxylic acid or anhydride thereof is bonded:
   10 to 80 parts by weight of the epoxy resin;
   10 to 80 parts by weight of the acid anhydride compound; and 0.05 to 5 parts by weight of the curing catalyst comprising one or more compounds selected from the group consisting of an imidazole-based compound, an imine-based compound, and an amine-based compound.

8. The adhesive resin composition according to claim 1, further comprising 50 to 1000 parts by weight of an organic solvent, based on 100 parts by weight of the styrene-ethylene-butylene-styrene copolymer.

9. The adhesive resin composition according to claim 8, wherein a viscosity of the adhesive resin composition changes by a ratio of 2 times or less compared to the initial viscosity within 72 hours, when exposed to the outside at room temperature.

10. The adhesive resin composition according to claim 1, wherein the adhesive resin composition has a dielectric loss factor (Df) of 0.010 or less in a dried state and at 5 GHz.

11. An adhesive film comprising a cured product of the adhesive resin composition of claim 1, and having a dielectric constant (Dk) of 2.8 or less in a dried state and at 5 GHz.

12. The adhesive film according to claim 11, wherein the adhesive film has a dielectric loss factor (Df) of 0.010 or less in a dried state and at 5 GHz.

13. The adhesive film according to claim 11, wherein the adhesive film has a thickness of 1 μm to 100 μm.

14. The adhesive resin composition according to claim 2, wherein the styrene-maleic anhydride copolymer has a weight average molecular weight of 1000 to 50,000.

15. The adhesive resin composition according to claim 2, wherein the styrene-maleic anhydride copolymer comprises 50 wt % to 95 wt % of styrene-derived repeat units.

16. A flexible metal laminate comprising: a polyimide resin film;
a metal thin film comprising one or more selected from the group consisting of copper, iron, nickel, titanium, aluminum, silver, gold, and alloys of two or more kinds thereof; and
the adhesive film of claim 14 formed between the polyimide film and the metal thin film.

17. The flexible metal laminate according to claim 16, wherein the polyimide resin film has a thickness of 1 μm to 50 μm, and
the polyimide resin film contains 5 to 75 wt % of a fluorine-based resin.

18. The flexible metal laminate according to claim 16, wherein the adhesive film has a dielectric constant (Dk) of 2.2 to 2.8 in a dried state and at 5 GHz.

19. The flexible metal laminate according to claim 16, wherein the adhesive film has a dielectric loss factor (Df) of 0.010 or less in a dried state and at 5 GHz.

* * * * *